(12) United States Patent
Huang et al.

(10) Patent No.: US 10,741,603 B2
(45) Date of Patent: Aug. 11, 2020

(54) IMAGE SENSOR AND METHOD FOR MANUFACTURING IMAGE SENSOR

(71) Applicant: HUAIAN IMAGING DEVICE MANUFACTURER CORPORATION, Huaian, Jiangsu (CN)

(72) Inventors: Xiaolu Huang, Jiangsu (CN); Xiangnan Lv, Jiangsu (CN); Yosuke Kitamura, Jiangsu (CN)

(73) Assignee: HUAIAN IMAGING DEVICE MANUFACTURER CORPORATION, Huaian (CN)

( * ) Notice: Subject to any disclaimer, the term of this patent is extended or adjusted under 35 U.S.C. 154(b) by 0 days.

(21) Appl. No.: 16/059,390

(22) Filed: Aug. 9, 2018

(65) Prior Publication Data

US 2019/0221601 A1    Jul. 18, 2019

(30) Foreign Application Priority Data

Jan. 16, 2018  (CN) .......................... 2018 1 0037345

(51) Int. Cl.
*H01L 21/00*  (2006.01)
*H01L 27/146*  (2006.01)
*H01L 31/0352*  (2006.01)

(52) U.S. Cl.
CPC .... *H01L 27/14643* (2013.01); *H01L 27/1463* (2013.01); *H01L 27/1464* (2013.01);
(Continued)

(58) Field of Classification Search
CPC .................................. H01L 21/67; H01L 21/77
See application file for complete search history.

(56) References Cited

U.S. PATENT DOCUMENTS

2008/0102557 A1* 5/2008 Kim .................. H01L 21/76224
                                                       438/73

FOREIGN PATENT DOCUMENTS

| CN | 104835826 A | 8/2015 |
| KR | 20070035649 A | 4/2007 |
| TW | 201639134 A | 11/2016 |

OTHER PUBLICATIONS

Office Action dated Jan. 28, 2019, in Chinese Application No. 201810037345.2 (8 pages).
(Continued)

*Primary Examiner* — Samuel A Gebremariam
(74) *Attorney, Agent, or Firm* — Bookoff McAndrews, PLLC

(57) ABSTRACT

A method for manufacturing an image sensor comprises: forming a trench around a photodiode, wherein the photodiode comprises a first doped region with a first conductivity type dopant formed in a semiconductor substrate with a second conductivity type dopant; forming a covering portion in the trench, the covering portion with the second conductivity type dopant covering at least a portion of a sidewall or a bottom wall of the trench, wherein a doping concentration of the covering portion is higher than a doping concentration of the semiconductor substrate; and diffusing the second conductivity type dopant in the covering portion into the semiconductor substrate so as to form a second doped region with the second conductivity type dopant surrounding the at least a portion of the sidewall or the bottom wall of the trench.

7 Claims, 3 Drawing Sheets

(52) U.S. Cl.
CPC .... *H01L 27/14689* (2013.01); *H01L 31/0352* (2013.01); *H01L 27/14612* (2013.01)

(56) References Cited

OTHER PUBLICATIONS

Official Communication dated Mar. 31, 2020, in corresponding CN Application No. 201810037345.2 (8 pages).

\* cited by examiner

IMAGE SENSOR AND METHOD FOR MANUFACTURING IMAGE SENSOR

CROSS-REFERENCE TO RELATED APPLICATIONS

This application claims priority to Chinese Patent Application No. 201810037345.2, filed on Jan. 16, 2018, which is hereby incorporated by reference in its entirety.

TECHNICAL FIELD

The present disclosure relates generally to the field of semiconductor technology, and more particularly, to an image sensor and a method for manufacturing an image sensor.

BACKGROUND

During manufacturing an image sensor, etching process on a semiconductor substrate may be performed.

Accordingly, there is a need for new technologies.

SUMMARY

One of aims of the present disclosure is to provide a new image sensor and a new method for manufacturing an image sensor.

One aspect of this disclosure is to provide a method for manufacturing an image sensor. The method may comprise: forming a trench around a photodiode, wherein the photodiode comprises a first doped region with a first conductivity type dopant formed in a semiconductor substrate with a second conductivity type dopant; forming a covering portion in the trench, the covering portion with the second conductivity type dopant covering at least a portion of a sidewall or a bottom wall of the trench, wherein a doping concentration of the covering portion is higher than a doping concentration of the semiconductor substrate; and diffusing the second conductivity type dopant in the covering portion into the semiconductor substrate so as to form a second doped region with the second conductivity type dopant surrounding the at least a portion of the sidewall or the bottom wall of the trench.

Another aspect of this disclosure is to provide an image sensor. The image sensor may comprise: a photodiode, wherein the photodiode comprises a first doped region with a first conductivity type dopant formed in a semiconductor substrate with a second conductivity type dopant; and an isolation structure formed in the semiconductor substrate and around the photodiode, wherein, the isolation structure comprises a body region and a second doped region with the second conductivity type dopant surrounding at least a portion of a sidewall or a bottom wall of the body region, and a doping concentration of the second doped region is higher than a doping concentration of the semiconductor substrate.

Further features of the present disclosure and advantages thereof will become apparent from the following detailed description of exemplary embodiments with reference to the attached drawings.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure will be better understood according the following detailed description with reference of the accompanying drawings.

Figure 1:
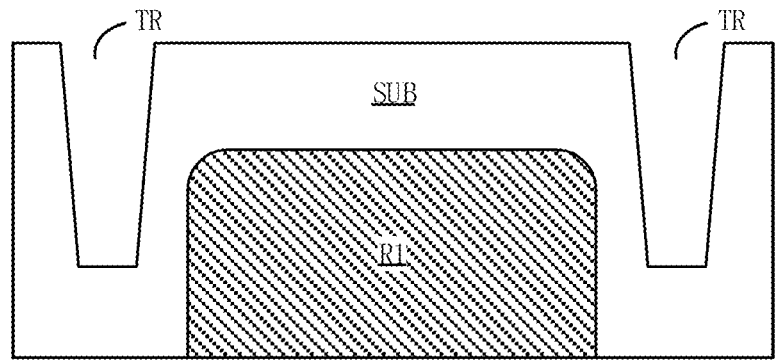
FIGS. 1 to 3 schematically illustrate respectively a method for manufacturing an image sensor according to one or more exemplary embodiments of this disclosure, in fragmentary cross sections of the image sensor at one or more steps.

Note that, in the embodiments described below, in some cases the same portions or portions having similar functions are denoted by the same reference numerals in different drawings, and description of such portions is not repeated. In some cases, similar reference numerals and letters are used to refer to similar items, and thus once an item is defined in one figure, it need not be further discussed for following figures.

In order to facilitate understanding, the position, the size, the range, or the like of each structure illustrated in the drawings and the like are not accurately represented in some cases. Thus, the disclosure is not necessarily limited to the position, size, range, or the like as disclosed in the drawings and the like.

DETAILED DESCRIPTION

Various exemplary embodiments of the present disclosure will be described in details with reference to the accompanying drawings in the following. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit this disclosure, its application, or uses. That is to say, the structure and method discussed herein are illustrated by way of example to explain different embodiments according to the present disclosure. It should be understood by those skilled in the art that, these examples, while indicating the implementations of the present disclosure, are given by way of illustration only, but not in an exhaustive way. In addition, the drawings are not necessarily drawn to scale, and some features may be enlarged to show details of some specific components.

Techniques, methods and apparatus as known by one of ordinary skill in the relevant art may not be discussed in detail, but are intended to be regarded as a part of the specification where appropriate.

In all of the examples as illustrated and discussed herein, any specific values should be interpreted to be illustrative only and non-limiting. Thus, other examples of the exemplary embodiments could have different values.

The inventors of the present disclosure discovered that etching process on a semiconductor substrate may cause a lattice defect or an interface defect that may degrade the performance of the image sensor. One possible reason causing the defect may be the semiconductor substrate is contaminated because of impurity particles entering the semiconductor substrate from a sidewall or a bottom wall of a trench formed during etching. These impurity particles may be particles from etching gas for dry etching, or other particles, different from those from the semiconductor substrate, falling into the trench.

As described above, the present disclosure is particularly applicable to an image sensor that requires an etching process on a semiconductor substrate and a manufacturing process thereof. However, those skilled in the art may appreciate that the present disclosure is not limited to an image sensor and a manufacturing process thereof, but may be applied to any semiconductor apparatus and any manufacturing process thereof, which requires an etching process on a semiconductor substrate In some embodiments, the method for manufacturing an image sensor of the present disclosure comprises the following steps which will be described below with reference to FIGS. 1 to 3.

As shown in FIG. 1, a trench TR is formed in a semiconductor substrate SUB and around a photodiode. For example, the trench TR may be formed by photolithography (and/or hard mask) and etching process. Etching process to form the trench TR, such as a dry etching process, may cause a lattice defect or an interface defect at the sidewall or the bottom wall of the trench TR. The defect in the image sensor may cause dark current and/or white pixel.

In image sensors, a plurality of photodiodes are usually arranged in an array, and each photodiode may absorb incident light and generate photo-generated carriers. Between neighboring photodiodes, there is usually an isolation structure. The isolation structure is disposed around a photodiode and prevents the photo-generated carriers in the photodiode from diffusing outward, e.g., diffusing into an adjacent photodiode. In the illustrative example shown in FIG. 1, forming the trench TR around the photodiode means that the trench TR is located around the photodiode in a plan view parallel to the main surface of the image sensor, for example, the trench TR is located between two neighboring photodiodes.

In the illustrative example shown in FIG. 1, the photodiode in the semiconductor substrate SUB is formed by forming a first doped region R1 with a first conductivity type dopant in the semiconductor substrate SUB with a second conductivity type dopant. The first doped region R1 with the first conductivity type dopant may be formed through an ion implanting process. That is, the first doped region R1 may be formed by implanting the first conductivity type dopant into the semiconductor substrate SUB with the second conductivity type dopant. Although the first doped region R1 is formed by implanting dopant from the bottom surface of the semiconductor substrate SUB in the illustrative example shown in FIG. 1, those skilled in the art may appreciate that the position of and the approach for forming the first doped region R1 are not limited in the present disclosure, for example, the first doped region R1 may be formed by implanting dopant from the top surface of the semiconductor substrate SUB.

Figure 2:
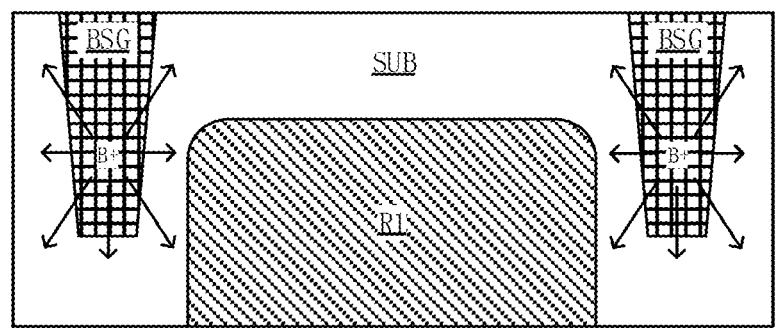
Figure 3:
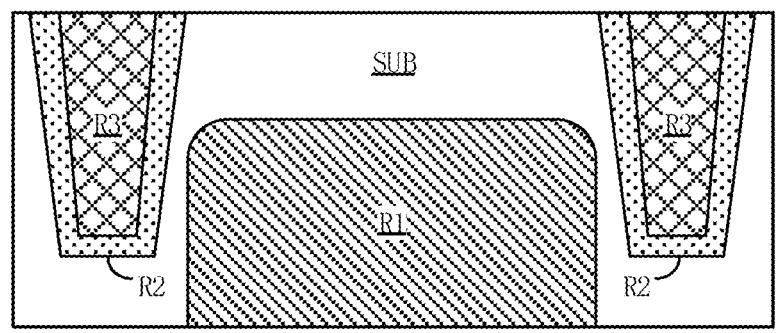

As shown in FIG. 2, a material may be filled into the trench TR with the second conductivity type dopant, wherein a doping concentration of the material is higher than a doping concentration of the semiconductor substrate SUB. Subsequently, the second conductivity type dopant in the material filled in the trench TR may diffuse, e.g., from the trench TR filled with material to the surrounding semiconductor substrate SUB, as schematically illustrated by the solid lines with arrows in FIG. 2, so as to form a second doped region R2 with the second conductivity type dopant surrounding the trench in the semiconductor substrate SUB. At the same time, the region in the trench TR filled with the material after diffusing is formed as the region R3. In this way, the second doped region R2 and the region R3 function together as an isolation structure capable of preventing the photo-generated carriers in the photodiode from diffusing outward. Those skilled in the art may appreciate that the solid lines with arrows in FIG. 2 merely schematically illustrate the direction of dopant (e.g., boron B+ as shown in FIG. 2) diffusing, which do not limit the direction and manner of dopant diffusing.

Those skilled in the art may appreciate that filling the material into the trench TR with the second conductivity type dopant may be performed by deposition processing with in-situ doping processing, by sputter processing, and the like. The term "fill" the trench TR used in the present disclosure may not mean filling up the trench TR or filling the entire trench TR, but may mean filling at least a portion of the trench TR. Although the material is filled in the entire trench TR in the illustrative example shown in FIG. 2 (referring to BSG in FIG. 2), those skilled in the art may appreciate that the material may be filled at least a portion of the trench TR, for example, the material may be formed covering at least a portion of a sidewall of the trench TR, covering at least a portion of a bottom wall of the trench TR, or covering both at least a portion of a sidewall and at least a portion of a bottom wall of the trench TR, instead of filling up the entire trench TR.

In the illustrative example shown in FIG. 2, the material filled into the trench TR is borosilicate glass (BSG), which comprises the second conductivity type dopant, i.e., boron B+. Preferably, the mole percentage of boron B+ in the borosilicate glass ranges from 1% to 10%, so that the doping concentration of the second doped region R2 (e.g., concentration of boron B+) after diffusing may be appropriate to function as an isolation structure or part of an isolation structure. Although the material (referring to BSG in FIG. 2) filled in the trench TR is borosilicate glass in the illustrative example shown in FIG. 2, those skilled in the art may appreciate that any dielectric material (e.g., silicon oxide, silicon nitride, and the like) comprising the second conductivity type dopant may be filled in the trench TR. The second conductivity type dopant may be boron, indium, gallium and the like when the second conductivity type is a P type, and may be phosphorus, arsenic and the like when the second conductivity type is an N type.

The diffusion of the second conductivity type dopant in the material filled in the trench TR may be facilitated through heating processing. Those skilled in the art may appreciate, the present disclosure does not limit the type of the heating process. For example, the heating process may be a furnace annealing process, a rapid thermal process (RTP) (e.g., a soak annealing process, a spike annealing processing, a millisecond annealing process or the like), a laser thermal process (LTP) (e.g., a nanosecond laser thermal process or the like) or the like.

In order to avoid adverse effects on other structures in the image sensor, the heating temperature in the heating process may not be too high; on the other hand, in order to facilitate the diffusion of dopant and ensure the activity of the dopant, the heating temperature in the heating process may not be too low. Preferably, the heating temperature in the heating process ranges from 400° C. to 700° C.

Since the second doped region R2 is formed by diffusing the second conductivity type dopant in the material filled in the trench TR into the semiconductor substrate SUB, the material of the second doped region R2 is semiconductor material doped with the second conductivity type dopant, and the semiconductor material forming the second doped region R2 is the same as the semiconductor material forming the semiconductor substrate SUB. In addition, since the second doped region R2 is formed by diffusing the second conductivity type dopant in the material filled in the trench TR into the semiconductor substrate SUB, the second doped region R2 may surround the trench TR. Those skilled in the art may appreciate that the term "surround" may be surrounding entirely or partially. Preferably, the second doped region R2 completely surrounds the sidewalls and the bottom wall of the trench TR.

In order to reduce adverse effects of a lattice defect or an interface defect caused by etching the trench TR, for example, to suppress the generation of dark current and/or white pixels, the doping concentration of the second doped region R2 of the isolation structure is higher than the doping concentration of the semiconductor substrate SUB. Thus, the second doped region R2 with the same doping type as the semiconductor substrate SUB and with a higher doping concentration is formed around the region R3 shown in FIG. 3 (i.e., the second doped region R2 located at the outer portion of the isolation structure, and the region R3 located at the inner portion of the isolation structure), thereby the defects caused by etching the trench TR are separated from the photodiode by the second doped region R2 so as to suppress the generation of dark current and/or white pixels.

Figure 4:
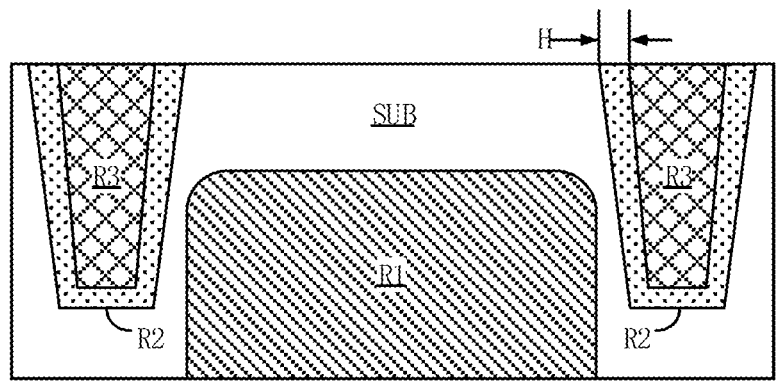
FIG. 4 schematically illustrates a configuration of an image sensor according to one or more exemplary embodiments of this disclosure.

On the other hand, in order not to reduce the performance of the photodiode, the width of the second doped region R2 (i.e., width H as shown in FIG. 4) should be as small as possible under the premise of ensuring the effect of isolating the defects caused by etching the trench TR from the photodiode, and the first doped region R1 does not contact with the second doped region R2. That is, a thin second doped region R2 is formed around the region R3, and a spacer region exists between the first doped region R1 and the second doped region R2. Preferably, the width of the second doped region R2 ranges from 10 nm to 30 nm. More preferably, the width of the second doped region R2 is 20 nm. Therefore, during the heating process, it is necessary to control the temperature and time of heating so as to make the width of the second doped region R2 formed by diffusing within an appropriate range.

In the illustrative example shown in FIG. 2, the first conductivity type is an N type and the second conductivity type is a P type. That is, a first doped region R1 with an N type dopant, heavily doped for example, is formed in a semiconductor substrate SUB with a P type dopant, lightly doped for example, so as to form a photodiode. A trench TR is formed around the photodiode, and a dielectric material (e.g., silicon oxide, silicon nitride, etc.) with a P type dopant (e.g., boron dopant, indium dopant, tellurium dopant, etc.) is filled in the trench TR. The P type dopant in the dielectric material diffuse all around, which may be facilitated through a heating process, so that the P type dopant in the dielectric material enter the semiconductor material around the trench TR, thereby forming a second doped region R2 with the P type dopant, heavily doped for example, surrounding the trench TR.

However, those skilled in the art may appreciate that in the above-described method for manufacturing an image sensor of the present disclosure, the first conductivity type may also be a P type, and the second conductivity type may also be an N type. That is, a first doped region R1 with a P type dopant, heavily doped for example, is formed in a semiconductor substrate SUB with an N type dopant, lightly doped for example, so as to form a photodiode. A trench TR is formed around the photodiode, and a dielectric material (e.g., silicon oxide, silicon nitride, etc.) with an N type dopant (e.g., phosphorus dopant, arsenic dopant, etc.) is filled in the trench TR. The N type dopant in the dielectric material diffuse all around, which may be facilitated through a heating process, so that the N type dopant in the dielectric material enter the semiconductor material around the trench TR, thereby forming a second doped region R2 with the N type dopant, heavily doped for example, surrounding the trench TR.

Figure 5:
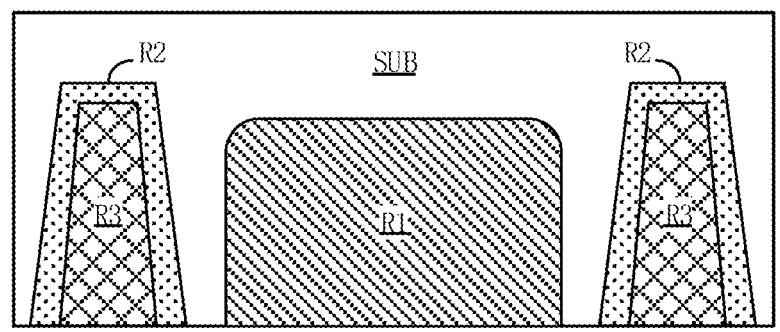
FIG. 5 schematically illustrates a configuration of an image sensor according to one or more exemplary embodiments of this disclosure.

In the illustrative examples shown in FIGS. 1 to 4, the first doped region R1 is formed by implanting dopant from the bottom surface of the semiconductor substrate SUB, and the trench TR is formed by etching from the top surface of the semiconductor substrate SUB. However, those skilled in the art may appreciate that in the method for manufacturing an image sensor of the present disclosure, it is also possible that the first doped region R1 is formed by implanting dopant from the bottom surface of the semiconductor substrate SUB, and the trench TR is also formed by etching from the bottom surface of the semiconductor substrate SUB, as shown in FIG. 5. For example, although not shown in the drawings, those skilled in the art may appreciate that in the method for manufacturing an image sensor of the present disclosure, it is also possible that the first doped region R1 is formed by implanting dopant from the top surface of the semiconductor substrate SUB, and the trench TR is also formed by etching from the top surface of the semiconductor substrate SUB; or, the first doped region R1 is formed by implanting dopant from the top surface of the semiconductor substrate SUB, and the trench TR is formed by etching from the bottom surface of the semiconductor substrate SUB.

Although a method for manufacturing an image sensor as shown in FIG. 3 or 4 has been described above with reference to FIGS. 1 to 3, those skilled in the art may appreciate that, an image sensor with other configurations may also be manufactured through the method similar to the above.

The present disclosure also relates to an image sensor. The image sensor of the present disclosure will be described in detail below with reference to an illustrative example shown in FIG. 6.

In some embodiments, an image sensor 100 of the present disclosure comprises a photodiode and isolation structures 50, 70 formed around the photodiode. In the image sensor, a plurality of photodiodes are arranged in an array, and each of the photodiodes may absorb incident light and generate photo-generated carriers. The isolation structures 50, 70 are disposed around the photodiode, configured to prevent the photo-generated carriers in the photodiode from diffusing outwards, for example, diffusing into neighboring photodiodes. The isolation structures 50, 70 formed around the photodiode means that the isolation structures 50, 70 is located around the photodiode in a plan view parallel to the main surface of the image sensor, that is, between two neighboring photodiodes.

The photodiode comprises a first doped region 20 with the first conductivity type dopant formed in a semiconductor substrate 10 with the second conductivity type dopant.

The photodiode in the semiconductor substrate 10 is formed by forming the first doped region 20 with the first conductivity type dopant in the semiconductor substrate 10 with the second conductivity type dopant. The first doped region 20 with the first conductivity type dopant included in the photodiode may be formed by implanting dopant, i.e., by implanting the first conductivity type dopant into the semiconductor substrate 10 with the second conductivity type dopant to form the first doped region 20. Although in the illustrative example shown in FIG. 6, the first doped region 20 is formed by implanting dopant from the front side (i.e., the bottom surface in the direction of the drawing) of the semiconductor substrate 10, those skilled in the art may appreciate that the position of and the approach forming the first doped region 20 in the semiconductor substrate 10 is not limited in the present disclosure, for example, the first doped region 20 may be formed by implanting dopant from the back side (i.e., the top surface in the direction of the drawing) of the semiconductor substrate 10.

Figure 6:
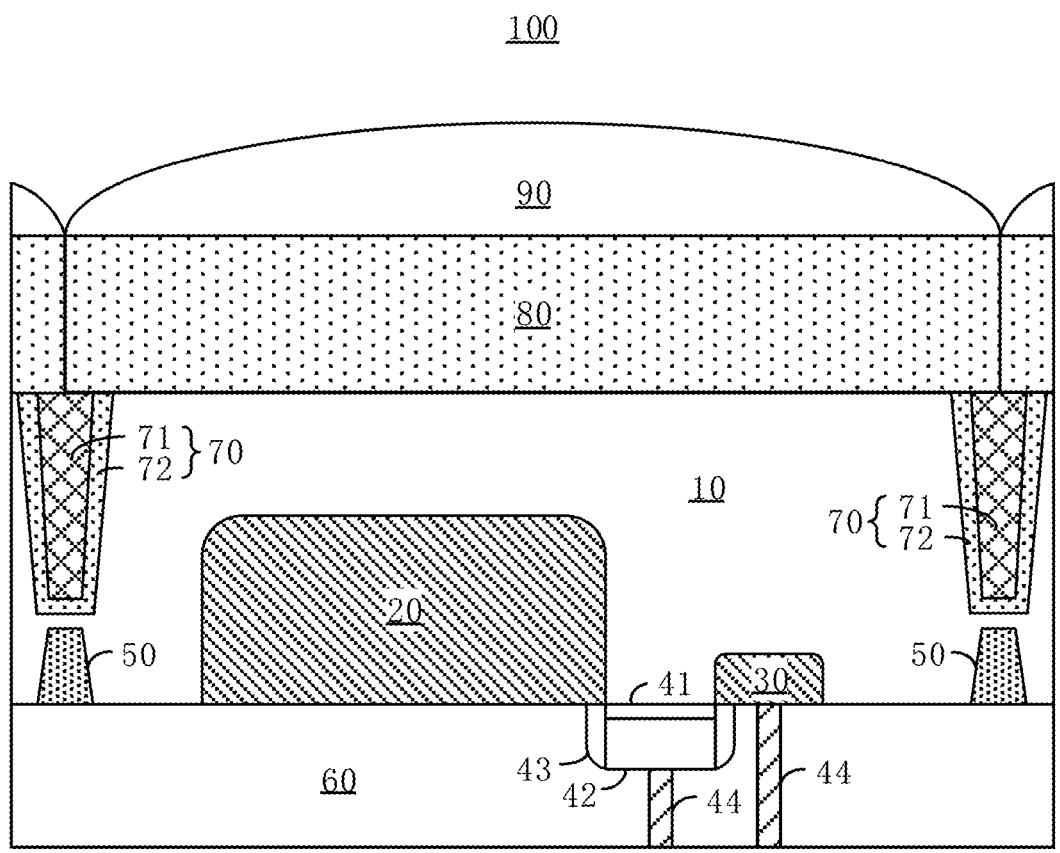
FIG. 6 schematically illustrates a configuration of an image sensor according to one or more exemplary embodiments of this disclosure.

In the illustrative example shown in FIG. 6, the isolation structure 50 and the isolation structure 70 are isolation structures formed respectively from the front side and the back side of the semiconductor substrate 10. The isolation structure 50 is a shallow trench isolation (STI) structure and the isolation structure 70 is a deep trench isolation (DTI) structure. Although in the illustrative example, the shallow trench isolation structure is formed from the front side of the semiconductor substrate 10, and the deep trench isolation structure is formed from the back side of the semiconductor substrate 10, those skilled in the art may appreciate that there is no limitation about that, for example, the shallow trench isolation structure may be formed from the back side of the semiconductor substrate 10, and the deep trench isolation structure may be formed from the front side of the semiconductor substrate 10.

In the illustrative example shown in FIG. 6, the isolation structure 70 comprises a body region 71 and a second doped region with the second conductivity type dopant 72 surrounding the body region 71, wherein the doping concentration of the second doped region 72 is higher than that doped in the semiconductor substrate 10. Those skilled in the art may appreciate that the second doped region 72 may entirely surround or partially surround the body region 71. Preferably, the second doped region R2 completely surrounds the side walls and the bottom wall of the body region 71. Thus, the second doped region R2 may isolate the photodiode from the lattice defect or interface defect caused by etching the trench, which may be either a deep trench or a shallow trench, of the isolation structure 70 so as to suppress the generation of dark current and/or white pixels, thereby reducing the adverse effects to the image sensor caused by the lattice defect or interface defect introduced by etching.

Although in the illustrative example shown in FIG. 6, the isolation structure 70 comprising the body region 71 and the second doped region 72 surrounding the body region 71 is shown, those skilled in the art may appreciate that the isolation structure 50 may also have similar structure. That is, the isolation structure 50 may also comprise a body region and a doped region with the second conductivity type dopant surrounding the body region, wherein the doping concentration of the doped region is higher than that doped in the semiconductor substrate 10. Thus, the doped region in the isolation structure 50 may isolate the photodiode from the lattice defect or interface defect caused by etching the trench, which may be either a deep trench or a shallow trench, of the isolation structure 50 so as to suppress the generation of dark current and/or white pixels, thereby reducing the adverse effects to the image sensor caused by the lattice defect or interface defect introduced by etching.

In order to achieve the effect of isolating the photodiode from the defects, the width of the formed second doped region (i.e., width H as shown in FIG. 4) should not be too small; at the same time, in order not to reduce the performance of the photodiode, the width of the second doped region R2 should not be too large. Preferably, the width of the second doped region R2 ranges from 10 nm to 30 nm. More preferably, the width of the second doped region R2 is 20 nm. Further, the first doped region 20 does not contact with the second doped region 72, so as not to reduce the performance of the photodiode.

At least a portion of the body region 71 may be formed of a dielectric material doped with the second conductivity type dopant. The at least a portion of the body region is located in an outer part of the body region 71, for example, located at at least a portion of a sidewall of the body region 71, at least a portion of a bottom wall of the body region 71, or the like. The material of the second doped region 72 is a semiconductor material doped with the second conductivity type dopant. In the case where the second doped region 72 is formed by diffusing the dopant in the dielectric material forming the at least a portion of the body region 71, the semiconductor material forming the second doped region 72 is the same as the semiconductor material forming the semiconductor substrate 10. In some embodiments, the dielectric material of the at least a portion of the body region 71 is borosilicate glass, and the material of the second doped region 72 is a semiconductor material doped with boron B+, wherein the second doped region 72 is formed by diffusing the boron B+ in the at least a portion of the body region 71.

In the case where the second doped region 72 is formed by diffusing the dopant in the material forming the at least a portion of the body region 71, a heating process may be performed to facilitate the diffusion of the second conductivity type dopant in the at least a portion of the body region 71 into the semiconductor material around the region 71. In order to avoid adverse effects on other structures in the image sensor, the heating temperature in the heating process may not be too high; on the other hand, in order to facilitate the diffusion of dopant and ensure the activity of the dopant, the heating temperature in the heating process should not be too low. Preferably, the heating temperature in the heating process ranges from 400° C. to 700° C.

The above mentioned other structures in the image sensor, on which the adverse effects are avoided, may comprise but not limit to: the semiconductor substrate 10, and the first doped region 20; a floating diffusion well 30 formed from the front side of the semiconductor substrate 10 and separated from the first doped region 20, and other devices; a gate dielectric layer 41, a gate electrode 42, sidewall spacers 43, and conductive contacts 44; isolation structures 50; and interlayer dielectric layer 60, interconnect metal and the like. After the isolation structure 70 is formed, optical filters 80 and microlenses 90 may be sequentially formed on the back side of the semiconductor substrate 10.

In some embodiments, the first conductivity type is an N type and the second conductivity type is a P type. That is, the semiconductor substrate 10 is P type doped, lightly doped for example, the first doped region 20 is N type doped, heavily doped for example, and the second doped region 72 is P type doped, heavily doped for example.

In some embodiments, the first conductivity type is a P type and the second conductivity type is an N type. That is, the semiconductor substrate 10 is N type doped, lightly doped for example, the first doped region 20 is P type doped, heavily doped for example, and the second doped region 72 is N type doped, heavily doped for example.

While the structure of the image sensor is described with reference to FIG. 6, those skilled in the art, may make modifications and variations to the structure of the image sensor without departing from the spirit of the present disclosure, and these modifications and variations still fall into the scope of the present disclosure.

While a structure of each image sensor has been shown in the accompanying drawings of the present disclosure in a form of fragmentary cross sections, an entire structure of each image sensor may be conceivable for those skilled in the art based on the description and accompanying drawings.

The term "A or B" used through the specification refers to "A and B" and "A or B" rather than meaning that A and B are exclusive, unless otherwise specified.

The terms "front," "back," "top," "bottom," "over," "under" and the like, as used herein, if any, are used for descriptive purposes and not necessarily for describing permanent relative positions. It should be understood that such terms are interchangeable under appropriate circumstances such that the embodiments of the disclosure described herein are, for example, capable of operation in other orientations than those illustrated or otherwise described herein.

The term "exemplary", as used herein, means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, summary or detailed description.

The term "substantially", as used herein, is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

In addition, the foregoing description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology, such as the terms "first", "second" and the like, may also be used in the following description for the purpose of reference only, and thus are not intended to be limiting. For example, the terms "first", "second" and other such numerical terms referring to structures or elements do not imply a sequence or order unless clearly indicated by the context.

Further, it should be noted that, the terms "comprise", "include", "have" and any other variants, as used herein, specify the presence of stated features, integers, steps, operations, elements, and/or components, but do not preclude the presence or addition of one or more other features, integers, steps, operations, elements, components, and/or groups thereof.

In this disclosure, the term "provide" is intended in a broad sense to encompass all ways of obtaining an object, thus the expression "providing an object" includes but is not limited to "purchasing", "preparing/manufacturing", "disposing/arranging", "installing/assembling", and/or "ordering" the object, or the like.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The description and drawings are, accordingly, to be regarded in an illustrative rather than in a restrictive sense.

Although some specific embodiments of the present disclosure have been described in detail with examples, it should be understood by a person skilled in the art that the above examples are only intended to be illustrative but not to limit the scope of the present disclosure. The embodiments disclosed herein can be combined arbitrarily with each other, without departing from the scope and spirit of the present disclosure. It should be understood by a person skilled in the art that the above embodiments can be modified without departing from the scope and spirit of the present disclosure. The scope of the present disclosure is defined by the attached claims.

What is claimed is:

1. A method for manufacturing an image sensor, comprising:
    operating on a front side of a semiconductor substrate with a second conductivity type to form a photodiode by forming a first doped region with a first conductivity type in the semiconductor substrate, to form a first trench isolation structure around the photodiode, and to form a gate structure for the photodiode;
    operating on a back side of the semiconductor substrate to form a trench around the photodiode such that the trench is located between the photodiode and an adjacent photodiode, wherein the back side of the semiconductor substrate is closer to a surface of the image sensor that receives light than the front side, and a depth of the trench is greater than a depth of the first trench isolation structure;
    filling the trench with a material with the second conductivity type, wherein a doping concentration of the material is higher than a doping concentration of the semiconductor substrate; and
    performing a heating process so that a second conductivity type dopant in the material diffuses into the semiconductor substrate so as to form a second doped region with the second conductivity type dopant surrounding the trench, and controlling a heating temperature and heating time in the heating process so as to prevent the second doped region from contacting the first doped region, wherein the material and the second doped region form a second trench isolation structure together.

2. The method according to claim 1, wherein the material is a dielectric material.

3. The method according to claim 1, wherein the material is borosilicate glass, and the second conductivity type dopant in the material is boron.

4. The method according to claim 3, wherein a mole percentage of the boron in the borosilicate glass ranges from 1% to 10%.

5. The method according to claim 1, wherein the heating temperature in the heating process ranges from 400° C. to 700° C.

6. The method according to claim 1, wherein a width of the second doped region ranges from 10 nm to 30 nm.

7. The method according to claim 1, wherein the first conductivity type is an N type and the second conductivity type is a P type.

* * * * *